(12) United States Patent
Chang et al.

(10) Patent No.: US 10,636,481 B1
(45) Date of Patent: Apr. 28, 2020

(54) MEMORY CELL FOR COMPUTING-IN-MEMORY APPLICATIONS, MEMORY UNIT FOR COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Meng-Fan Chang, Taichung (TW); Xin Si, Hsinchu (TW); Yung-Ning Tu, Changhua County (TW); Jia-Jing Chen, Taoyuan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/409,892

(22) Filed: May 13, 2019

(51) Int. Cl.
   *G11C 11/419* (2006.01)
   *G11C 11/418* (2006.01)

(52) U.S. Cl.
   CPC .......... *G11C 11/419* (2013.01); *G11C 11/418* (2013.01)

(58) Field of Classification Search
   CPC .......................... G11C 11/419; G11C 11/418
   See application file for complete search history.

(56) References Cited

U.S. PATENT DOCUMENTS

| | | | | |
|---|---|---|---|---|
| 6,711,051 B1 * | 3/2004 | Poplevine | ............ | G11C 11/419 365/154 |
| 7,092,279 B1 * | 8/2006 | Sheppard | ................. | G11C 7/02 257/E21.656 |
| 7,286,383 B1 * | 10/2007 | Poplevine | ................ | G11C 7/12 365/189.08 |
| 7,495,948 B2 * | 2/2009 | Suzuki | ..................... | G11O 5/14 365/154 |
| 8,248,867 B2 * | 8/2012 | Mikan, Jr. | ............. | G11C 11/413 365/154 |
| 8,320,163 B2 * | 11/2012 | Lee | ........................ | G11C 11/412 365/154 |
| 9,042,149 B2 * | 5/2015 | Lee | .......................... | G11C 7/18 365/51 |
| 2010/0157661 A1 * | 6/2010 | Kushida | ................ | G11C 11/419 365/156 |

OTHER PUBLICATIONS

Xin Si et al., "A Twin-8T SRAM Computation-In-Memory Macro for Multiple-Bit CNN-Based Machine Learning", 2019 International Solid-State Circuits Conference, dated on Feb. 17-21, 2019, pp. 396-398, United States.

* cited by examiner

*Primary Examiner* — Tri M Hoang
(74) *Attorney, Agent, or Firm* — CKC & Partners Co., LLC

(57) ABSTRACT

A memory cell for computing-in-memory applications is controlled by a first bit line, a second bit line, a word line and a read word line. The read word line transmits an input value. The memory cell includes a plurality of read-decoupled cells. Each of the read-decoupled cells stores a weight and includes a first read-decoupled transistor and a second read-decoupled transistor. The first read-decoupled transistor has a first transistor width and is controlled by the weight. The second read-decoupled transistor has a second transistor width equal to the first transistor width and generates a read bit line signal according to the input value, the weight and the second transistor width. The second transistor width of the second read-decoupled transistor of one of the read-decoupled cells is two times larger than the second transistor width of the second read-decoupled transistor of another one of the read-decoupled cells.

20 Claims, 15 Drawing Sheets

MEMORY CELL FOR COMPUTING-IN-MEMORY APPLICATIONS, MEMORY UNIT FOR COMPUTING-IN-MEMORY APPLICATIONS AND COMPUTING METHOD THEREOF

BACKGROUND

Technical Field

The present disclosure relates to a memory cell, a memory unit and a computing method thereof. More particularly, the present disclosure relates to a memory cell for computing-in-memory applications, a memory unit for computing-in-memory applications and a computing method thereof.

Description of Related Art

In these years, due to the industrial growth of mobile device, medical electrical equipment, portable storage, etc., requirement of memory with low power, high speed and high density is increased. Computation-in-Memory (CIM) is a promising solution to improve the energy efficiency of multiplication-and-accumulation (MAC) operations for AI chips, and multiple-bit convolutional neural network (CNN) is required for high inference accuracy in many applications. However, static random access memory (SRAM) CIM faces challenges and tradeoffs in (1) signal margin vs. cell stability and area overhead; (2) process variation on high-weighted bit dominates the error rate; and (3) input bandwidth vs. speed and area.

Conventional SRAM CIM macros were limited to binary in-memory-computing (IMC) MAC operations for fully connected networks, or they used IMC for multiplication or weight-combination operations with additional large-area near-memory computing (NMC) logics for summation or full MAC operations. Accordingly, a memory cell for computing-in-memory applications, a memory unit for the computing-in-memory applications and a computing method thereof having the features of increasing signal margin and input bandwidth and reducing area overhead and vulnerability to process variation are commercially desirable.

SUMMARY

According to one aspect of the present disclosure, a memory cell for computing-in-memory applications is controlled by a first bit line, a second bit line, a word line and a read word line. The read word line transmits an input value. The memory cell for the computing-in-memory applications includes a plurality of read-decoupled cells. The read-decoupled cells are connected to the first bit line, the second bit line, the word line and the read word line. Each of the read-decoupled cells stores a weight and includes a first read-decoupled transistor and a second read-decoupled transistor. The first read-decoupled transistor has a first transistor width and is controlled by the weight. The second read-decoupled transistor is connected to the first read-decoupled transistor and the read word line. The second read-decoupled transistor has a second transistor width equal to the first transistor width and generates a read bit line signal according to the input value, the weight and the second transistor width. The second transistor width of the second read-decoupled transistor of one of the read-decoupled cells is two times larger than the second transistor width of the second read-decoupled transistor of another one of the read-decoupled cells.

According to another aspect of the present disclosure, a memory unit for computing-in-memory applications is controlled by a first bit line, a second bit line, a word line and a read word line. The read word line transmits an input value, and the memory unit for the computing-in-memory applications includes a plurality of memory cells arranged in matrix. Each of the memory cells is one of an even-row memory cell and an odd-row memory cell. The even-row memory cell is located in an even row. The odd-row memory cell is located in an odd row, and each of the memory cells includes a plurality of read-decoupled cells. The read-decoupled cells are connected to the first bit line, the second bit line, the word line and the read word line. Each of the read-decoupled cells stores a weight and includes a first read-decoupled transistor and a second read-decoupled transistor. The first read-decoupled transistor has a first transistor width and is controlled by the weight. The second read-decoupled transistor is connected to the first read-decoupled transistor and the read word line. The second read-decoupled transistor has a second transistor width equal to the first transistor width and generates a read bit line signal according to the input value, the weight and the second transistor width. In each of the memory cells, the second transistor width of the second read-decoupled transistor of one of the read-decoupled cells is two times larger than the second transistor width of the second read-decoupled transistor of another one of the read-decoupled cells.

According to further another aspect of the present disclosure, a computing method of the memory unit for the computing-in-memory applications provides a voltage level applying step and a computing step. The voltage level applying step is for applying a plurality of voltage levels to the first bit line, the second bit line, the word line, the read word line and the weight, respectively. The computing step is for driving each of the read-decoupled cells of the memory cells of the memory unit to generate the read bit line signal according to the voltage levels of the input value, the weight and the second transistor width.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a power supply voltage VDD. The voltage level of "0" represents that the voltage is equal to a ground voltage VSS. A PMOS transistor and an NMOS transistor represent a P-type MOS transistor and an N-type MOS transistor, respectively. Each transistor has a source, a drain and a gate.

Figure 1:
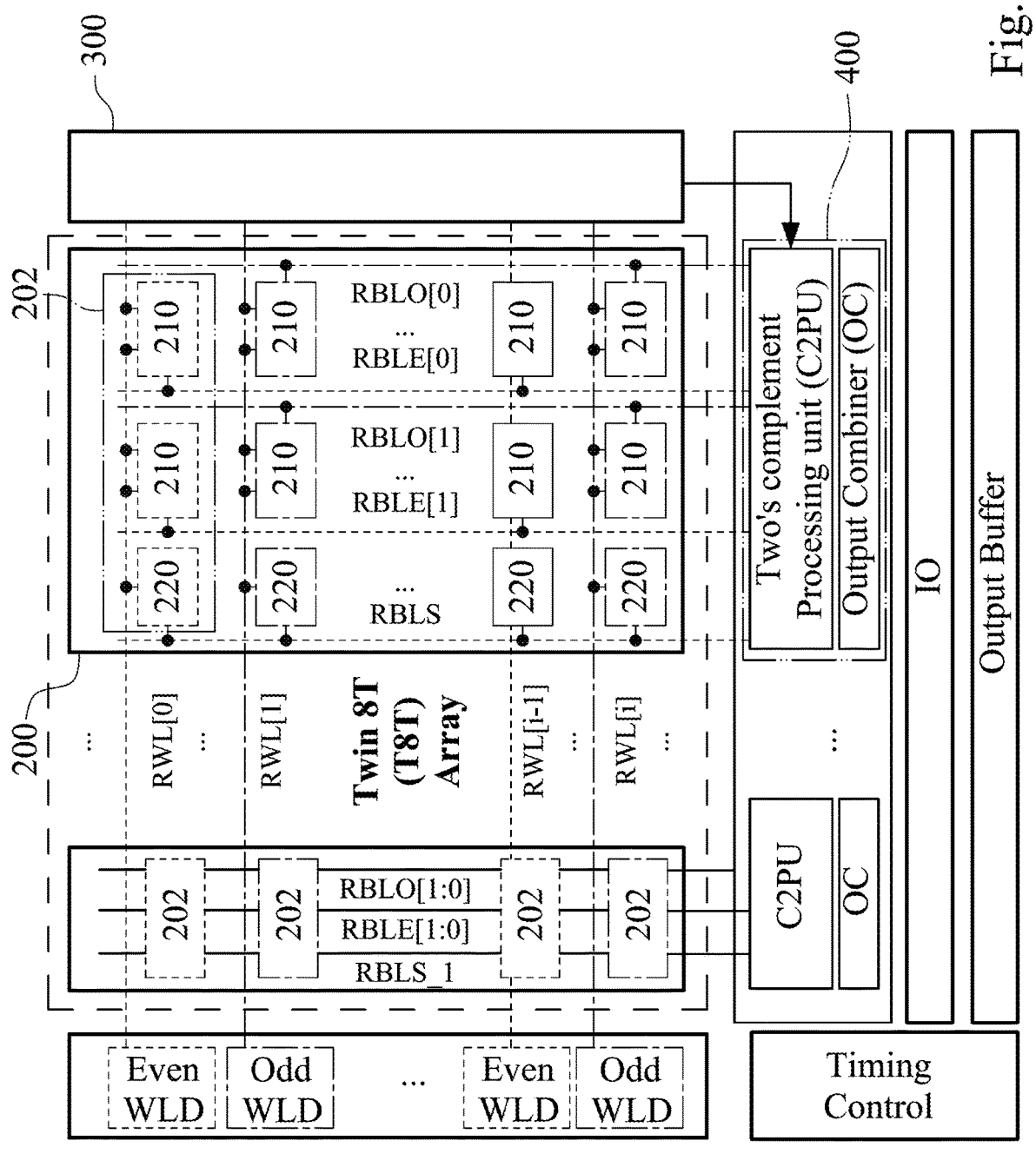
FIG. 1 shows a block diagram of a memory circuit for computing-in-memory applications according to a first embodiment of the present disclosure.
Figure 2:
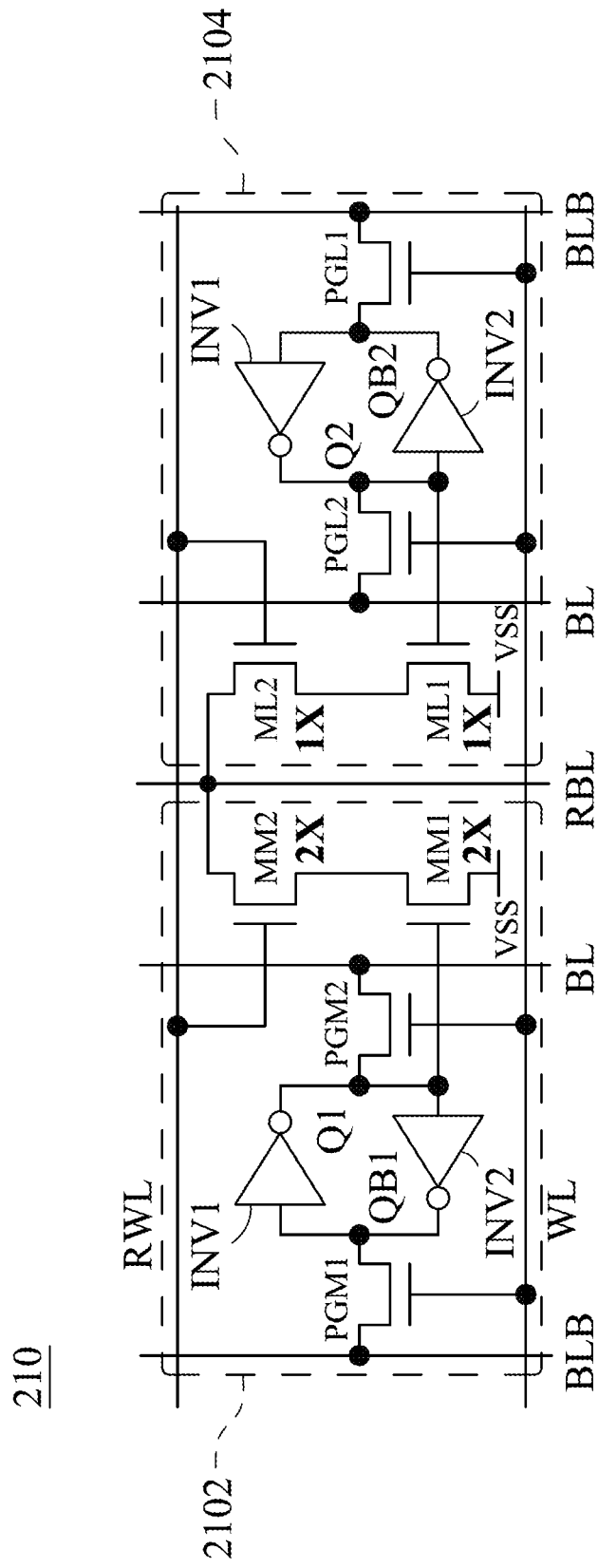
FIG. 2 shows a circuit diagram of a first type of a memory cell of the memory circuit of FIG. 1.
Figure 3:
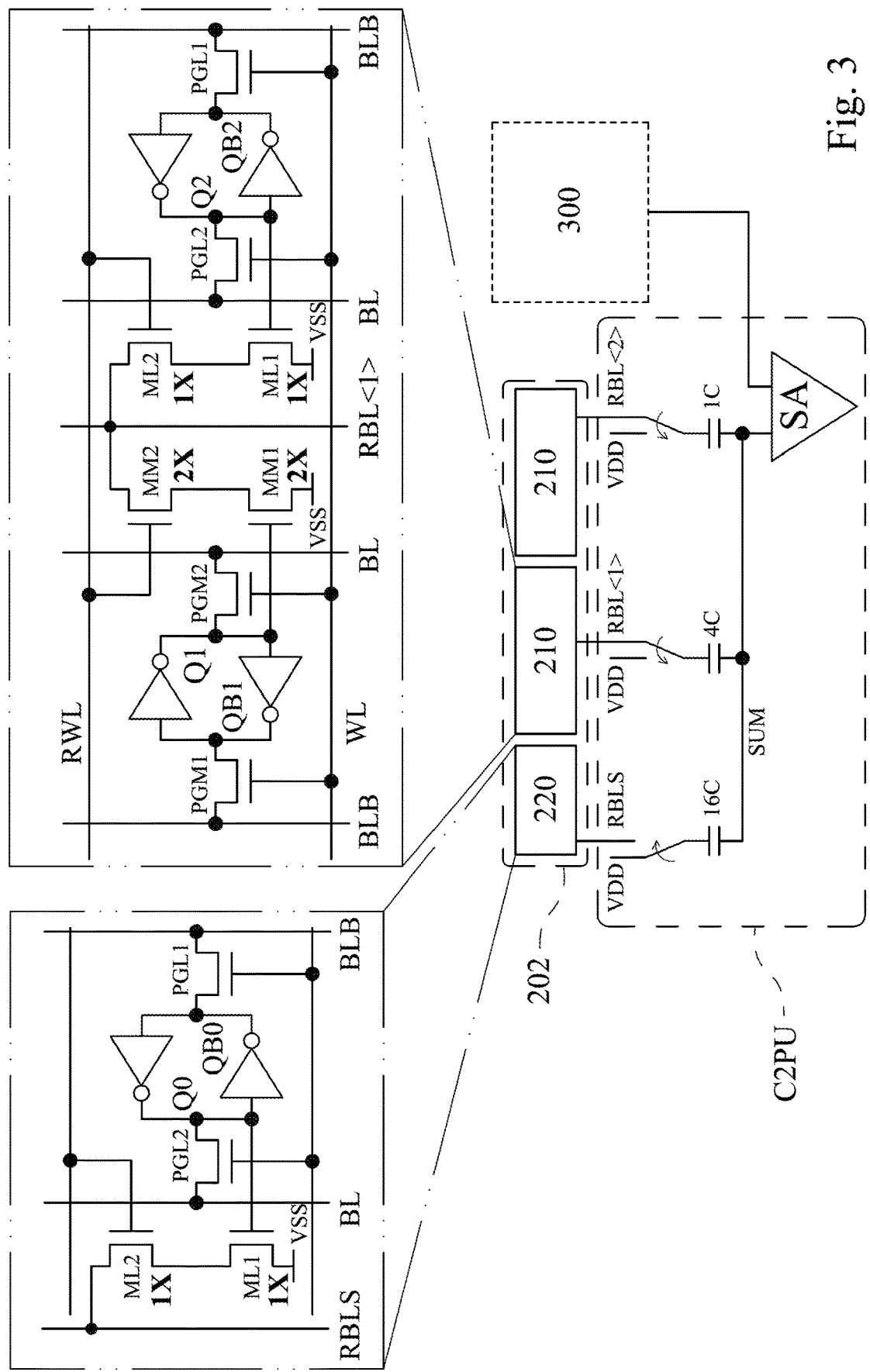
FIG. 3 shows a circuit block diagram of a memory module and a two's complement processing unit of the memory circuit of FIG. 1, which includes the first type of the memory cell of FIG. 2.
Figure 4:
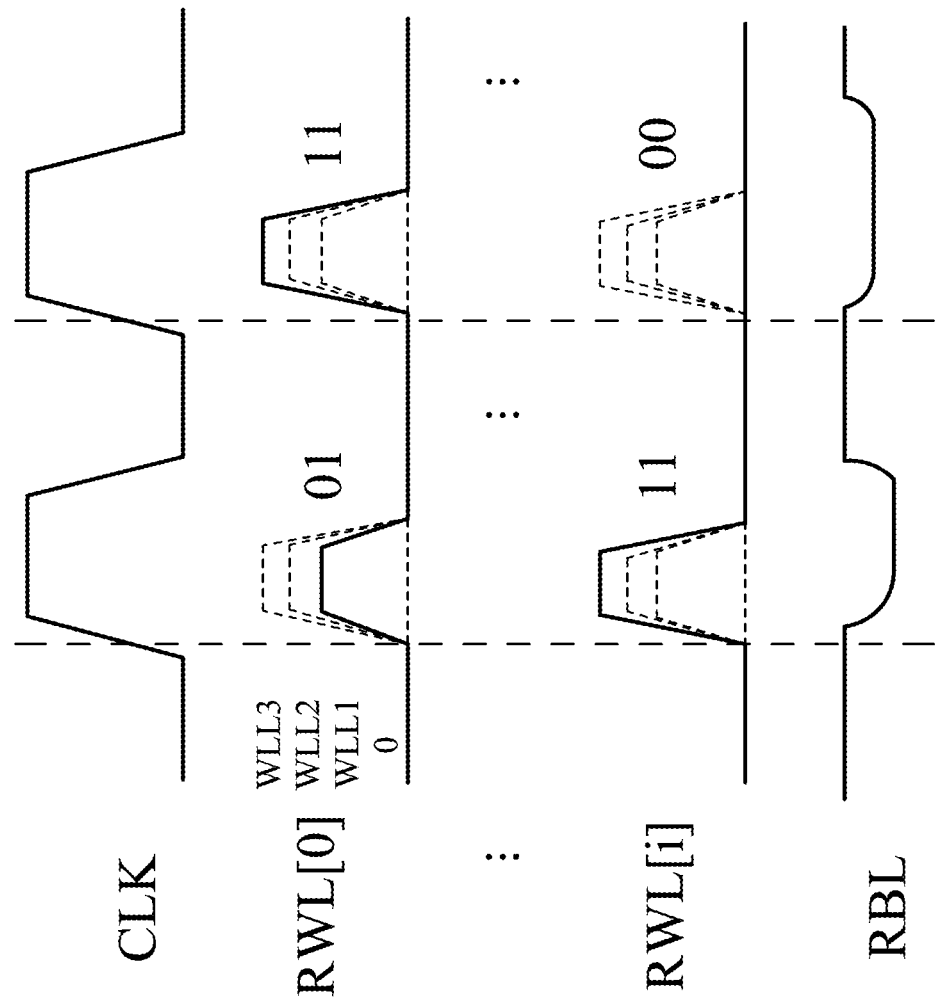
FIG. 4 shows timing diagrams of voltages of read word lines of FIG. 3.
Figure 11:
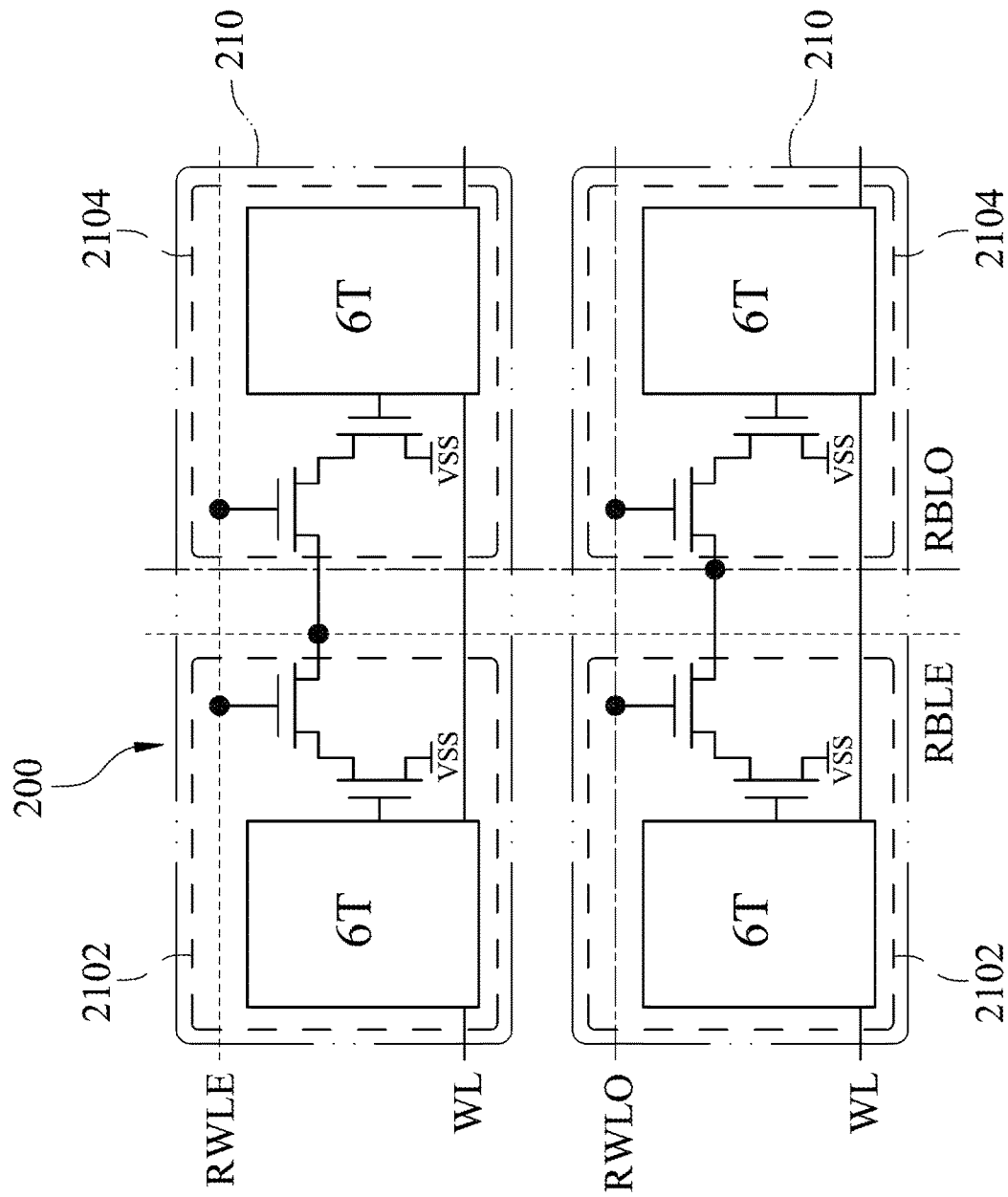
FIG. 11 shows a circuit block diagram of a memory unit including the first type of the memory cell of FIG. 2 with an even-odd dual channel scheme.

FIG. 1 shows a block diagram of a memory circuit 100 for computing-in-memory (CIM) applications according to a first embodiment of the present disclosure. FIG. 2 shows a circuit diagram of a first type of a memory cell 210 of the memory circuit 100 of FIG. 1. FIG. 3 shows a circuit block diagram of a memory module 202 and a two's complement processing unit C2PU of the memory circuit 100 of FIG. 1, which includes the first type of the memory cell 210 of FIG. 2. FIG. 4 shows timing diagrams of voltages of read word lines RWL[0], RWL[n] of FIG. 3. FIG. 11 shows a circuit block diagram of a memory unit 200 including the first type of the memory cell 210 of FIG. 2 with an even-odd dual channel (EODC) scheme. The memory circuit 100 for the computing-in-memory applications includes a plurality of memory units 200, a configurable reference columns (CRC) unit 300 and a processing unit 400.

Each of the memory units 200 includes a plurality of memory modules 202. Each of the memory modules 202 includes two memory cells 210 and one memory cell 220. Each of the memory units 200 is controlled by a first bit line BL, a second bit line BLB, a word line WL and a read word line RWL. The read word line RWL transmits an input value. Each of the two memory cells 210 includes a plurality of read-decoupled cells. In addition, the memory cells 210, 220 are arranged in matrix. Each of the memory cells 210, 220 may be one of an even-row memory cell and an odd-row memory cell. The even-row memory cell is located in an even row and connected to an even word line driver Even WLD. The even word line driver Even WLD includes an even-row read word line RWLE. The odd-row memory cell is located in an odd row and connected to an odd word line driver Odd WLD. The odd word line driver Odd WLD includes an odd-row read word line RWLO, as shown in FIG. 1.

In the embodiment of FIG. 2, a number of the read-decoupled cells of the first type of the memory cell 210 is two. The read-decoupled cells of the first type of the memory cell 210 are connected to the first bit line BL, the second bit line BLB, the word line WL and the read word line RWL. Each of the read-decoupled cells of the first type of the memory cell 210 stores a weight. The read-decoupled cells of the first type of the memory cell 210 include a first read-decoupled cell 2102 and a second read-decoupled cell 2104.

The first read-decoupled cell 2102 has a first node Q1 and a second node QB1. The first node Q1 transmits the weight of the first read-decoupled cell 2102. The first node Q1 and the second node QB1 have opposite voltage levels. The first read-decoupled cell 2102 includes a first read-decoupled transistor MM1, a second read-decoupled transistor MM2, a first pass transistor PGM1, a second pass transistor PGM2, a first inverter INV1 and a second inverter INV2. The first read-decoupled transistor MM1 has a first transistor width and controlled by the weight. The second read-decoupled transistor MM2 is connected to the first read-decoupled transistor MM1 and the read word line RWL. The second read-decoupled transistor MM2 has a second transistor width equal to the first transistor width and generates a read bit line signal according to the input value, the weight and the second transistor width. The read bit line signal is transmitted by a combined read bit line RBL. The first pass transistor PGM1 is connected to the second node QB1, the second bit line BLB and the word line WL. The second pass transistor PGM2 is connected to the first node Q1, the first bit line BL and the word line WL. The first inverter INV1 is located between the first node Q1 and the second node QB1. The second inverter INV2 is connected to the first inverter INV1.

The second read-decoupled cell 2104 has a first node Q2 and a second node QB2. The first node Q2 transmits the weight of the second read-decoupled cell 2104. The first node Q2 and the second node QB2 have opposite voltage levels. The second read-decoupled cell 2104 includes a first read-decoupled transistor ML1, a second read-decoupled transistor ML2, a first pass transistor PGL1, a second pass transistor PGL2, a first inverter INV1 and a second inverter INV2. The first read-decoupled transistor ML1 has a first transistor width and controlled by the weight. The second read-decoupled transistor ML2 is connected to the first read-decoupled transistor ML1 and the read word line RWL. The second read-decoupled transistor ML2 has a second transistor width equal to the first transistor width and generates a read bit line signal according to the input value, the weight and the second transistor width. The read bit line signal is transmitted by the combined read bit line RBL. The first pass transistor PGL1 is connected to the second node QB2, the second bit line BLB and the word line WL. The second pass transistor PGL2 is connected to the first node Q2, the first bit line BL and the word line WL. The first inverter INV1 is located between the first node Q2 and the second node QB2. The second inverter INV2 is connected to the first inverter INV1. In other words, the first read-decoupled cell 2102 is connected to the second read-decoupled cell 2104 via the word line WL, the read word line RWL and the combined read bit line RBL. The combined read bit line RBL has a combined read bit line signal equal to a sum of the read bit line signal of the first read-decoupled cell 2102 and the read bit line signal of the second read-decoupled cell 2104.

In detail, the first read-decoupled transistor MM1 of the first read-decoupled cell 2102 has a first read-decoupled gate, a first read-decoupled drain and a first read-decoupled source. The first read-decoupled gate is coupled to the first node Q1 of the first read-decoupled cell 2102, and the first read-decoupled source is coupled to the ground voltage VSS. The second read-decoupled transistor MM2 of the first read-decoupled cell 2102 has a second read-decoupled gate, a second read-decoupled drain and a second read-decoupled source. The second read-decoupled gate is coupled to the read word line RWL. The second read-decoupled drain is coupled to the combined read bit line RBL. The second read-decoupled source is coupled to the first read-decoupled drain of the first read-decoupled transistor MM1 of the first read-decoupled cell 2102. In addition, the first read-decoupled transistor ML1 of the second read-decoupled cell 2104 has another first read-decoupled gate, another first read-decoupled drain and another first read-decoupled source. The another first read-decoupled gate is coupled to the first node Q2 of the second read-decoupled cell 2104, and the another first read-decoupled source is coupled to the ground voltage VSS. The second read-decoupled transistor ML2 of the second read-decoupled cell 2104 has another second read-decoupled gate, another second read-decoupled drain and another second read-decoupled source. The another second read-decoupled gate is coupled to the read word line RWL. The another second read-decoupled drain is coupled to the combined read bit line RBL. The another second read-decoupled source is coupled to the another first read-decoupled drain of the first read-decoupled transistor ML1 of the second read-decoupled cell 2104.

In FIG. 3, the memory cell 220 has a first node Q0 and a second node QB0. The first node Q0 transmits the weight of the memory cell 220. The first node Q0 and the second node QB0 have opposite voltage levels. The detail of the memory cell 220 of FIG. 3 is the same as the second read-decoupled cell 2104 of FIG. 2. The memory cells 220 of the memory modules 202 of each of the memory units 200 are connected to each other via a sign-bit read bit line RBLS which is used for calculating a sign bit, as shown in FIG. 1. The memory cells 210 of the memory modules 202 of each of the memory units 200 are connected to each other via a first combined read bit line RBL<1> and a second combined read bit line RBL<2>.

In the first type of the memory cell 210 of FIG. 2, the second transistor width (2×) of the second read-decoupled transistor MM2 of the first read-decoupled cell 2102 is two times larger than the second transistor width (1×) of the second read-decoupled transistor ML2 of the second read-decoupled cell 2104 so as to provide weighted cell currents. Table 1 lists 2-bit input values, the weights, the weighted cell currents $I_{RBL}$ on the combined read bit line RBL and multiply accumulate values MACV of the first type of the memory cell 210 of FIG. 2. There are fourth voltage levels of the read word line RWL which are corresponding to WLL3, WLL2, WLL1 and VSS (0 V), respectively, as shown in FIG. 4. The 2-bit input values are corresponding to the voltage levels of the read word line RWL. In FIGS. 2-4 and Table 1, the weighted cell currents $I_{RBL}$ and the multiply accumulate values MACV can be computed by the 2-bit input values and the weights. The first combined read bit line RBL<1>, the second combined read bit line RBL<2>, the sign-bit read bit line RBLS and a sum value SUM are described as follows:

$$RBL<1>/RBL<2> = \Sigma[RWL \times (2Q1+Q2)] \quad (1).$$

$$RBLS = \Sigma[RWL \times Q0] \quad (2).$$

$$SUM = (-16) \times RBLS + (4) \times RBL<1> + (1) \times RBL<2> \quad (3).$$

Therefore, the present disclosure provides a configurable static random access memory (SRAM) CIM macro with 1-bit to 4-bit inputs and 1-bit to 5-bit weights with up to 7-bit outputs of the multiply accumulate values MACV. The memory units 200 of the present disclosure utilizes compact-rule compatible twin-8T (T8T) cells for weighted CIM multiply accumulate operations to enable full voltage swings on the combined read bit line RBL so as to increase signal margin without the suffering read-disturb or write-disturb issues in a conventional 6T SRAM cell. Moreover, the memory units 200 of the present disclosure are suitable for the computing-in-memory applications and may reduce area overhead and vulnerability to process variation.

TABLE 1

| 2-bit input | RWL | Weight 2102 | 2104 | $I_{RBL}$ | MACV |
|---|---|---|---|---|---|
| 11 | WLL3 | 1 | 1 | $3 \times I_{MC}$ | 9 |
| 10 | WLL2 | 1 | 1 | $2 \times I_{MC}$ | 6 |
| 01 | WLL1 | 1 | 1 | $I_{MC}$ | 3 |
| 11 | WLL3 | 1 | 0 | $2 \times I_{MC}$ | 6 |
| 10 | WLL2 | 1 | 0 | $4/3 \times I_{MC}$ | 4 |
| 01 | WLL1 | 1 | 0 | $2/3 \times I_{MC}$ | 2 |
| 11 | WLL3 | 0 | 1 | $I_{MC}$ | 3 |
| 10 | WLL2 | 0 | 1 | $2/3 \times I_{MC}$ | 2 |
| 01 | WLL1 | 0 | 1 | $1/3 \times I_{MC}$ | 1 |
| 00 | VSS | 1/0 | 1/0 | 0 | 0 |

In FIGS. 1, 2 and 11, if the first type of the memory cell 210 is corresponding to the even-row memory cell, the read word line RWL is corresponding to the even word line driver Even WLD of FIG. 2 (e.g., the even-row read word line RWLE of FIG. 11), and the read bit line signal is corresponding to a combined even-row read bit line RBLE of FIG. 11. The first read-decoupled cell 2102 is connected to the second read-decoupled cell 2104 via the word line WL, the read word line RWL (i.e., the even-row read word line RWLE of FIG. 11) and the combined even-row read bit line RBLE. The second read-decoupled transistor MM2 of the first read-decoupled cell 2102, the second read-decoupled transistor ML2 of the second read-decoupled cell 2104 and the combined even-row read bit line RBLE are connected to each other.

If the first type of the memory cell 210 is corresponding to the odd-row memory cell, the read word line RWL is corresponding to the odd word line driver Odd WLD of FIG. 2 (e.g., the odd-row read word line RWLO of FIG. 11), and the read bit line signal is corresponding to a combined odd-row read bit line RBLO of FIG. 11. The another first read-decoupled cell 2102 is connected to the another second read-decoupled cell 2104 via the word line WL, the read word line RWL (i.e., the odd-row read word line RWLO of FIG. 11) and the combined odd-row read bit line RBLO. The second read-decoupled transistor MM2 of the another first read-decoupled cell 2102, the second read-decoupled transistor ML2 of the another second read-decoupled cell 2104 and the combined odd-row read bit line RBLO are connected to each other. The combined odd-row read bit line RBLO is disconnected from the combined even-row read bit line RBLE. Therefore, the even-odd dual channel scheme of the present disclosure can extend a bandwidth of convolutional neural network (CNN) operations and reduce energy consumption. In addition, the even-odd dual channel scheme of the present disclosure can reduce half the number of cells and a parasitic load on a conventional read bit line RBL in a conventional memory cell array. By using original metal wires for the read bit line RBL of each memory cell, the combined odd-row read bit line RBLO and the combined even-row read bit line RBLE in the even-odd dual channel scheme of the present disclosure don't consume extra area in the layout.

The CRC unit 300 is connected to the memory units 200. The processing unit 400 is connected to the CRC unit 300 and the memory units 200. The processing unit 400 includes the two's complement processing unit C2PU and an output combiner OC. The two's complement processing unit C2PU includes a plurality of switches, a plurality of capacitors and a sense amplifier SA. The number of the switches, the number of the capacitors and the amount of capacitance of capacitors are determined by the memory unit 200. The two's complement processing unit C2PU is configured to process signals of the sign-bit read bit line RBLS, the first combined read bit line RBL<1> and the second combined read bit line RBL<2>. The output combiner OC is configured to combine the multiply accumulate values MACV from different cycles and output a final multiple-bit MACVout.

Figure 5:
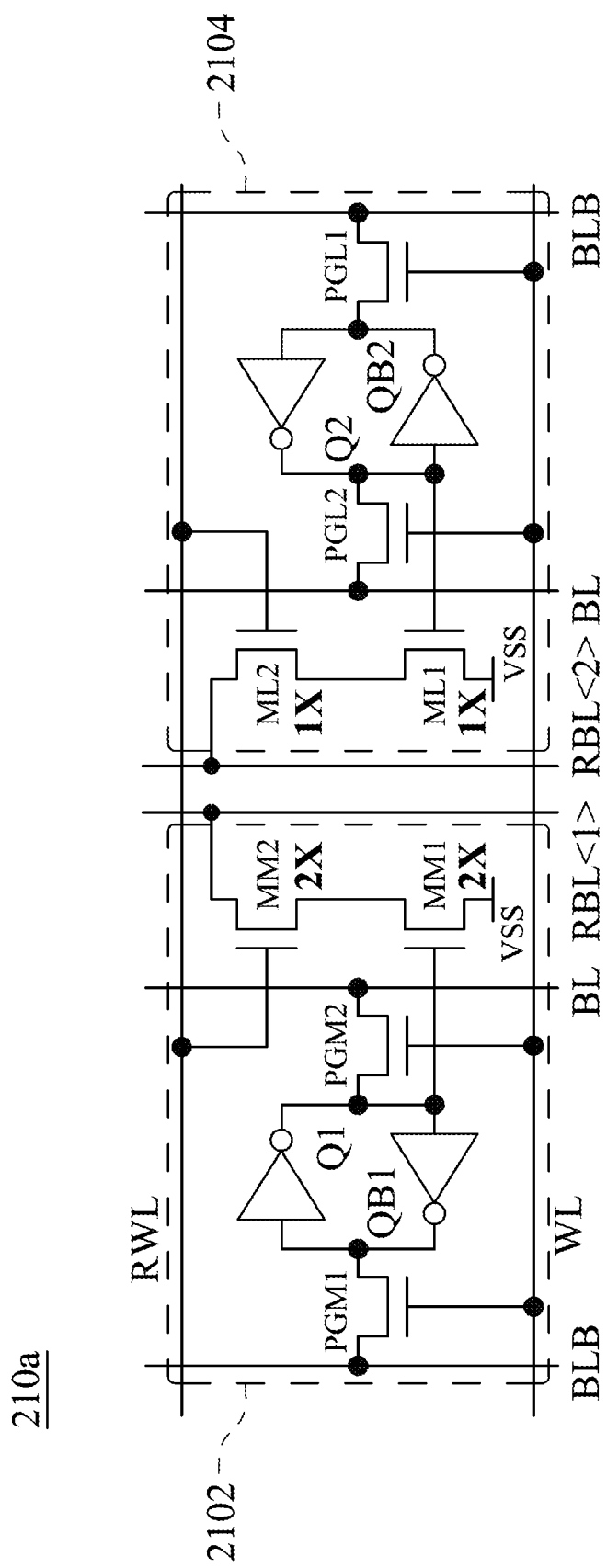
FIG. 5 shows a circuit diagram of a second type of a memory cell according to a second embodiment of the present disclosure.
Figure 6:
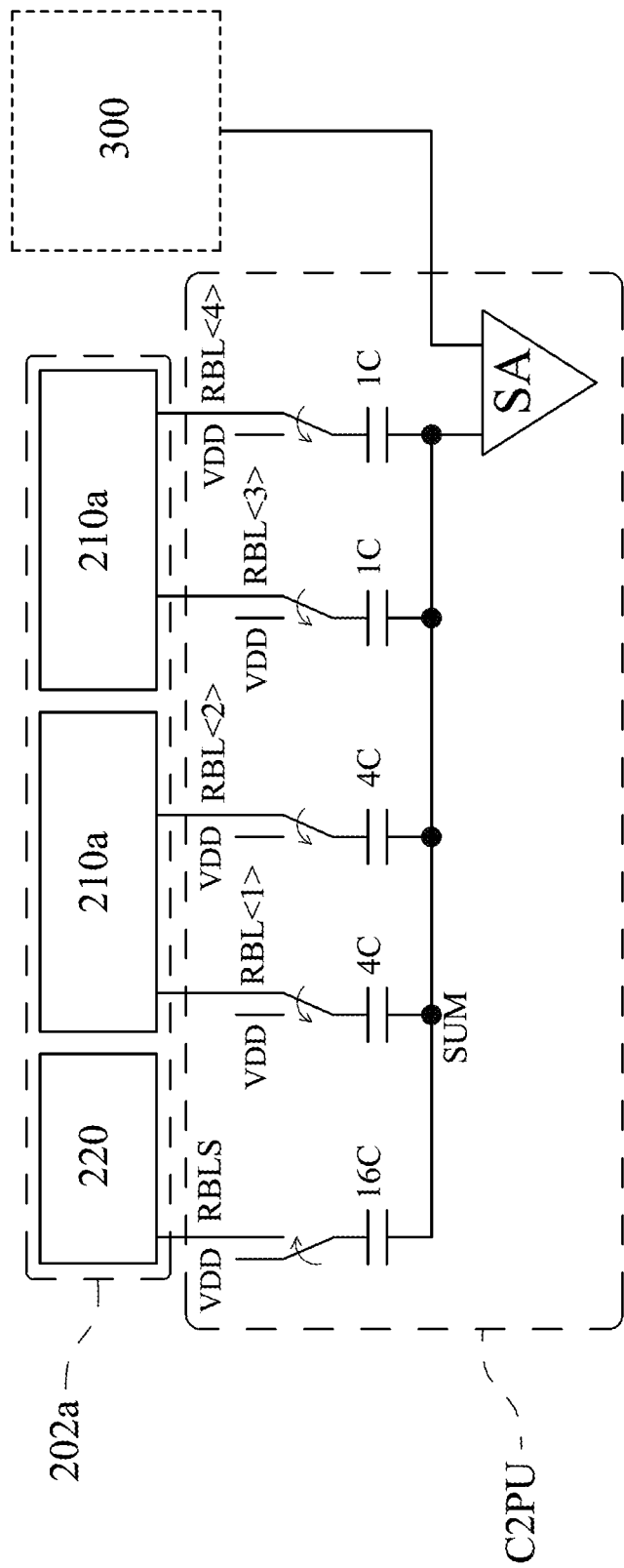
FIG. 6 shows a circuit block diagram of a memory module and a two's complement processing unit of a memory circuit according to the second embodiment of the present disclosure, which includes the second type of the memory cell of FIG. 5.

FIG. 5 shows a circuit diagram of a second type of a memory cell 210a according to a second embodiment of the present disclosure. FIG. 6 shows a circuit block diagram of a memory module 202a and a two's complement processing unit C2PU of a memory circuit 100 according to the second embodiment of the present disclosure, which includes the second type of the memory cell 210a of FIG. 5. The second type of a memory cell 210a includes a first read-decoupled cell 2102 and a second read-decoupled cell 2104. The detail of the first read-decoupled cell 2102 and the second read-decoupled cell 2104 of FIG. 5 is the same as the first read-decoupled cell 2102 and the second read-decoupled cell 2104 of FIG. 2. The second read-decoupled drain of the second read-decoupled transistor MM2 of the first read-decoupled cell 2102 is disconnected from the another second read-decoupled drain of the second read-decoupled transistor ML2 of the second read-decoupled cell 2104. In the memory module 202a of FIG. 6, two memory cells 210a generate four read bit lines RBL<1>, RBL<2>, RBL<3>, RBL<4>. The read bit lines RBL<1>, RBL<2>, RBL<3>, RBL<4>, a sign-bit read bit line RBLS and a sum value SUM are described as follows:

$$RBL<1>/RBL<3>=\Sigma[RWL\times 2Q1] \quad (4).$$

$$RBL<2>/RBL<4>=\Sigma[RWL\times Q2] \quad (5).$$

$$RBLS=\Sigma[RWL\times Q0] \quad (6).$$

$$SUM=(-16)\times RBLS+(4)\times RBL<1>+(4)\times RBL<2>+(1)\times RBL<3>+(1)\times RBL<4> \quad (7).$$

Figure 7:
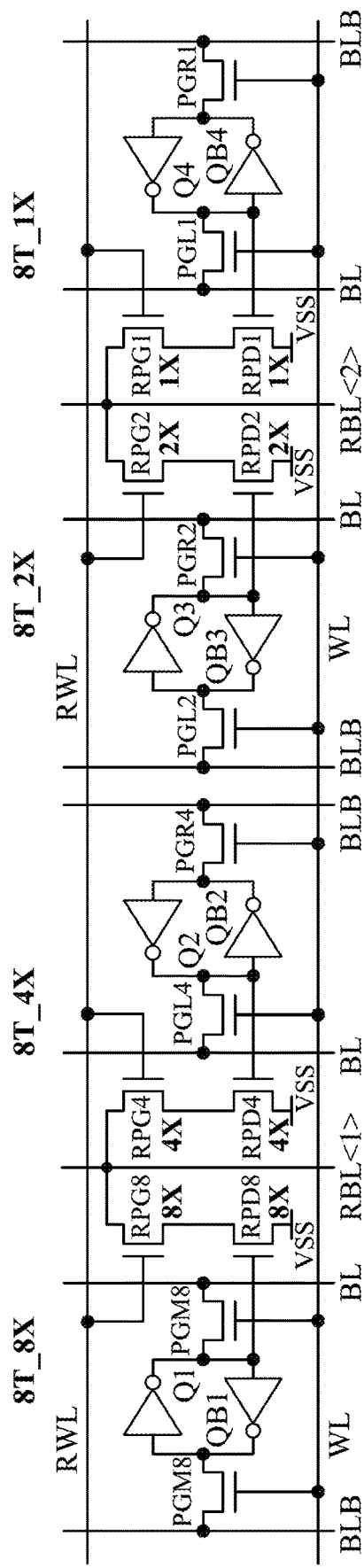
FIG. 7 shows a circuit diagram of a third type of a memory cell according to a third embodiment of the present disclosure.
Figure 8:
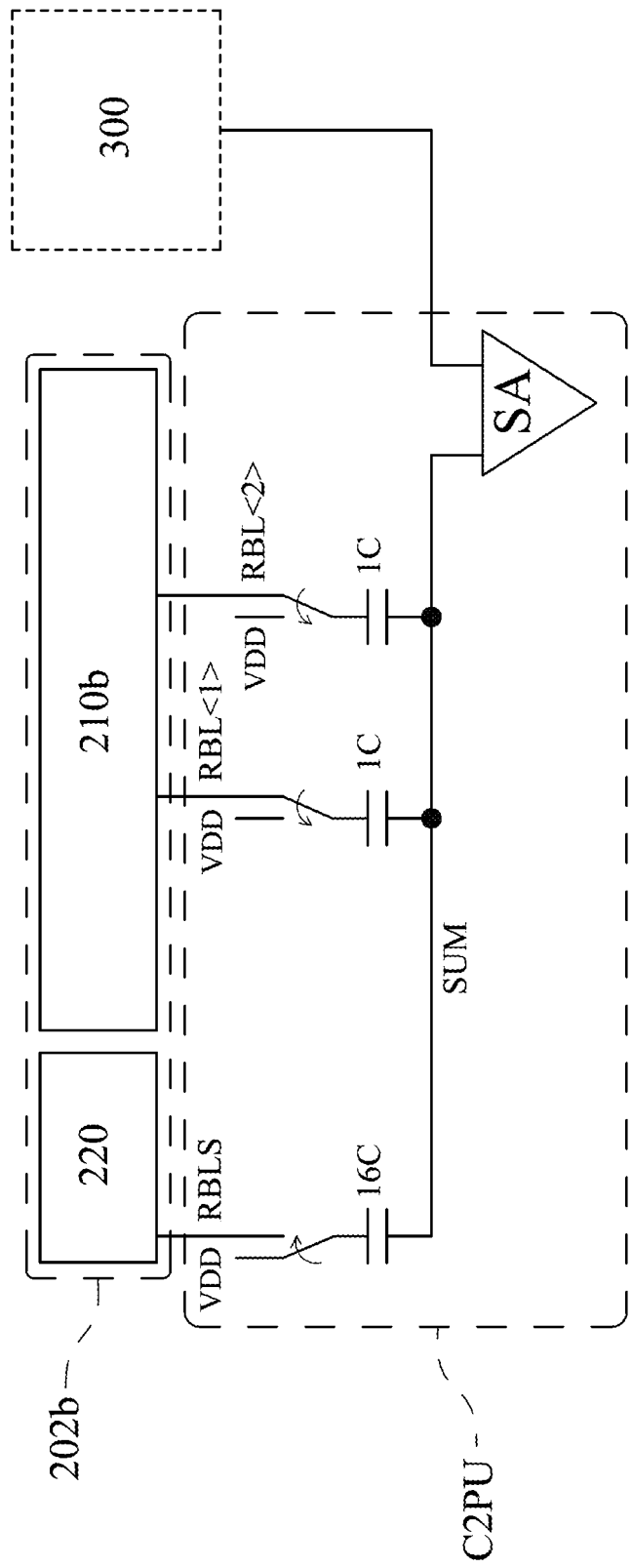
FIG. 8 shows a circuit block diagram of a memory module and a two's complement processing unit of a memory circuit according to the third embodiment of the present disclosure, which includes the third type of the memory cell of FIG. 7.

FIG. 7 shows a circuit diagram of a third type of a memory cell 210b according to a third embodiment of the present disclosure. FIG. 8 shows a circuit block diagram of a memory module 202b and a two's complement processing unit C2PU of a memory circuit 100 according to the third embodiment of the present disclosure, which includes the third type of the memory cell 210b of FIG. 7. The third type of the memory cell 210b includes a plurality of read-decoupled cells. A number of the read-decoupled cells is four, and the read-decoupled cells include a first read-decoupled cell 8T_8x, a second read-decoupled cell 8T_4x, a third read-decoupled cell 8T_2x and a fourth read-decoupled cell 8T_1x. The second transistor width (8x) of the second read-decoupled transistor RPG8 of the first read-decoupled cell 8T_8x is two times larger than the second transistor width (4x) of the second read-decoupled transistor RPG4 of the second read-decoupled cell 8T_4x. The second transistor width (4x) of the second read-decoupled transistor RPG4 of the second read-decoupled cell 8T_4x is two times larger than the second transistor width (2x) of the second read-decoupled transistor RPG2 of the third read-decoupled cell 8T_2x. The second transistor width (2x) of the second read-decoupled transistor RPG2 of the third read-decoupled cell 8T_2x is two times larger than the second transistor width (1x) of the second read-decoupled transistor RPG1 of the fourth read-decoupled cell 8T_1x. The first read-decoupled cell 8T_8x is connected to the second read-decoupled cell 8T_4x via the word line WL, the read word line RWL and a first combined read bit line RBL<1>. The first combined read bit line RBL<1> has a first combined read bit line signal equal to a sum of the read bit line signal of the first read-decoupled cell 8T_8x and the read bit line signal of the second read-decoupled cell 8T_4x. The third read-decoupled cell 8T_2x is connected to the fourth read-decoupled cell 8T_1x via the word line WL, the read word line RWL and a second combined read bit line RBL<2>. The second combined read bit line RBL<2> has a second combined read bit line signal equal to a sum of the read bit line signal of the third read-decoupled cell 8T_2x and the read bit line signal of the fourth read-decoupled cell 8T_1x. In FIGS. 7 and 8, the first combined read bit line RBL<1>, the second combined read bit line RBL<2>, a sign-bit read bit line RBLS and a sum value SUM are described as follows:

$$RBL<1>=\Sigma[RWL\times(8Q1+4Q2)] \quad (8).$$

$$RBL<2>=\Sigma[RWL\times(2Q3+1Q4)] \quad (9).$$

$$RBLS=\Sigma[RWL\times Q0] \quad (10).$$

$$SUM=(-16)\times RBLS+(1)\times RBL<1>+(1)\times RBL<2> \quad (11).$$

Figure 9:
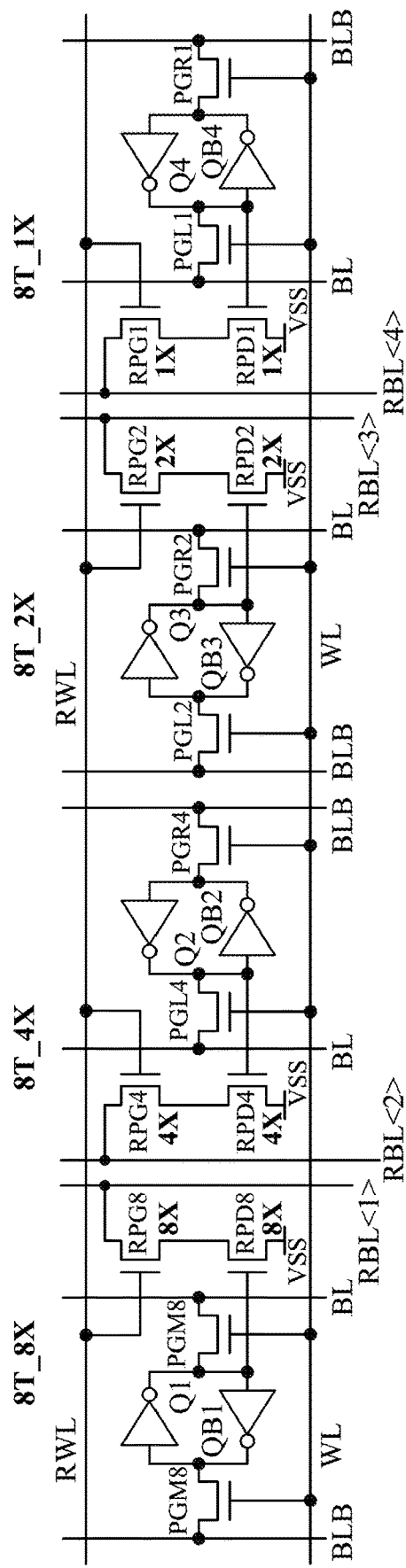
FIG. 9 shows a circuit diagram of a fourth type of a memory cell according to a fourth embodiment of the present disclosure.
Figure 10:
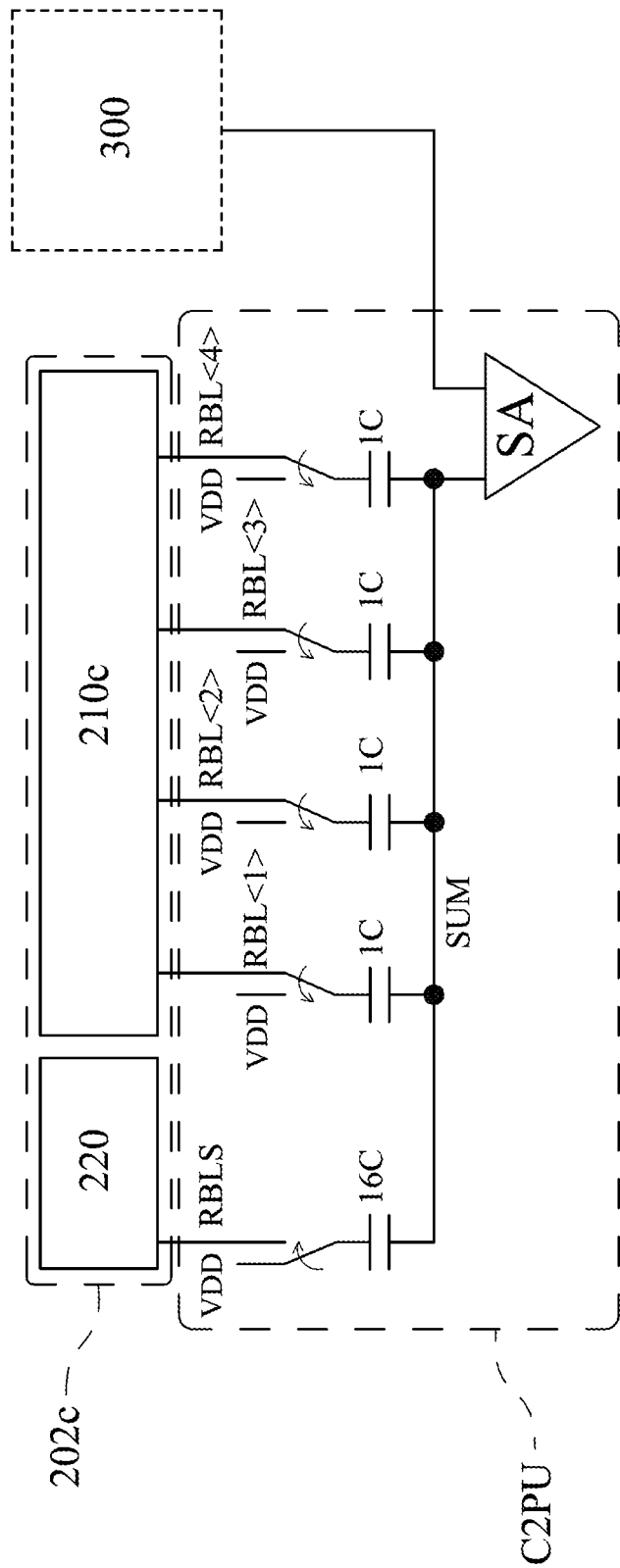
FIG. 10 shows a circuit block diagram of a memory module and a two's complement processing unit of a memory circuit according to the fourth embodiment of the present disclosure, which includes the fourth type of the memory cell of FIG. 9.

FIG. 9 shows a circuit diagram of a fourth type of a memory cell 210c according to a third embodiment of the present disclosure. FIG. 10 shows a circuit block diagram of a memory module 202c and a two's complement processing unit C2PU of a memory circuit 100 according to the fourth embodiment of the present disclosure, which includes the fourth type of the memory cell 210c of FIG. 9. The third type of the memory cell 210c includes a plurality of read-decoupled cells. A number of the read-decoupled cells is four, and the read-decoupled cells include a first read-decoupled cell 8T_8x, a second read-decoupled cell 8T_4x, a third read-decoupled cell 8T_2x and a fourth read-decoupled cell 8T_1x. The first read-decoupled cell 8T_8x, the second read-decoupled cell 8T_4x, the third read-decoupled cell 8T_2x and the fourth read-decoupled cell 8T_1x are connected to each other via the word line WL and the read word line RWL. The detail of the first read-decoupled cell 8T_8x, the second read-decoupled cell 8T_4x, the third read-decoupled cell 8T_2x and the fourth read-decoupled cell 8T_1x of FIG. 9 is the same as the first read-decoupled cell 8T_8x, the second read-decoupled cell 8T_4x, the third read-decoupled cell 8T_2x and the fourth read-decoupled cell 8T_1x of FIG. 7. The second read-decoupled transistor RPG8 of the first read-decoupled cell 8T_8x has a second read-decoupled drain to generate a first read bit line signal RBL<1>. The second read-decoupled transistor RPG4 of the second read-decoupled cell 8T_4x has a second read-decoupled drain to generate a second read bit line signal RBL<2>. The second read-decoupled transistor RPG2 of the third read-decoupled cell 8T_2× has a second read-decoupled drain to generate a third read bit line signal RBL<3>. The second read-decoupled transistor RPG1 of the fourth read-decoupled cell 8T_1× has a second read-decoupled drain to generate a fourth read bit line signal RBL<4>. The second read-decoupled drain of the second read-decoupled transistor RPG8 of the first read-decoupled cell 8T_8×, the second read-decoupled drain of the second read-decoupled transistor RPG4 of the second read-deand the odd channels both support configurable (1/2/4 bits) input precision. When the input precision is binary or 2 bits, the memory cell 210 (T8T CIM) requires only one cycle to compute the multiply accumulate value MACV. When the input precision is 4 bits ($IN_m[3:0]$, m=1–n), each input is applied to an assigned channel using two sequential cycles, e.g., $IN_m[3:2]$ and $IN_m[1:0]$. The output combiner OC combines the MACV results from the $1^{st}$ cycle ($IN_m[1:0]$) and $2^{nd}$ cycle ($IN_m[3:2]$), and then outputs the final multiple-bit MACVout.

TABLE 2

| | Input stream mapping ways | | | | | |
|---|---|---|---|---|---|---|
| | Even channel (RWLE) | | | Odd channel (RWLO) | | |
| Operating modes | 1 bit | 2 bit | 4 bit | 1 bit | 2 bit | 4 bit |
| 2CA mode | $INE_m[0]$ | $INE_m[1:0]$ | $INE_m[3:2], INE_m[1:0]$ | $INO_m[0]$ | $INO_m[1:0]$ | $INO_m[3:2], INO_m[1:0]$ |
| SC mode | $INE_m[0]$ | $INE_m[1:0]$ | $INE_m[3:2], INE_m[1:0]$ | Bypass | | |
| | | Bypass | | $INO_m[0]$ | $INO_m[1:0]$ | $INO_m[3:2], INO_m[1:0]$ | coupled cell 8T_4×, the second read-decoupled drain of the second read-decoupled transistor RPG2 of the third read-decoupled cell 8T_2× and the second read-decoupled drain of the second read-decoupled transistor RPG1 of the fourth read-decoupled cell 8T_1× are disconnected from each other. In FIGS. 9 and 10, the read bit lines RBL<1>, RBL<2>, RBL<3>, RBL<4>, a sign-bit read bit line RBLS and a sum value SUM are described as follows:

$$RBL<1>=\Sigma[RWL \times 8Q1] \quad (12).$$

$$RBL<2>=\Sigma[RWL \times 4Q2] \quad (13).$$

$$RBL<3>=\Sigma[RWL \times 2Q3] \quad (14).$$

$$RBL<4>=\Sigma[RWL \times 1Q4] \quad (15).$$

$$RBLS=\Sigma[RWL \times Q0] \quad (16).$$

$$SUM=(-16) \times RBLS+(1) \times RBL<1>+(1) \times RBL<2>+(1) \times RBL<3>+(1) \times RBL<4> \quad (17).$$

Figure 12:
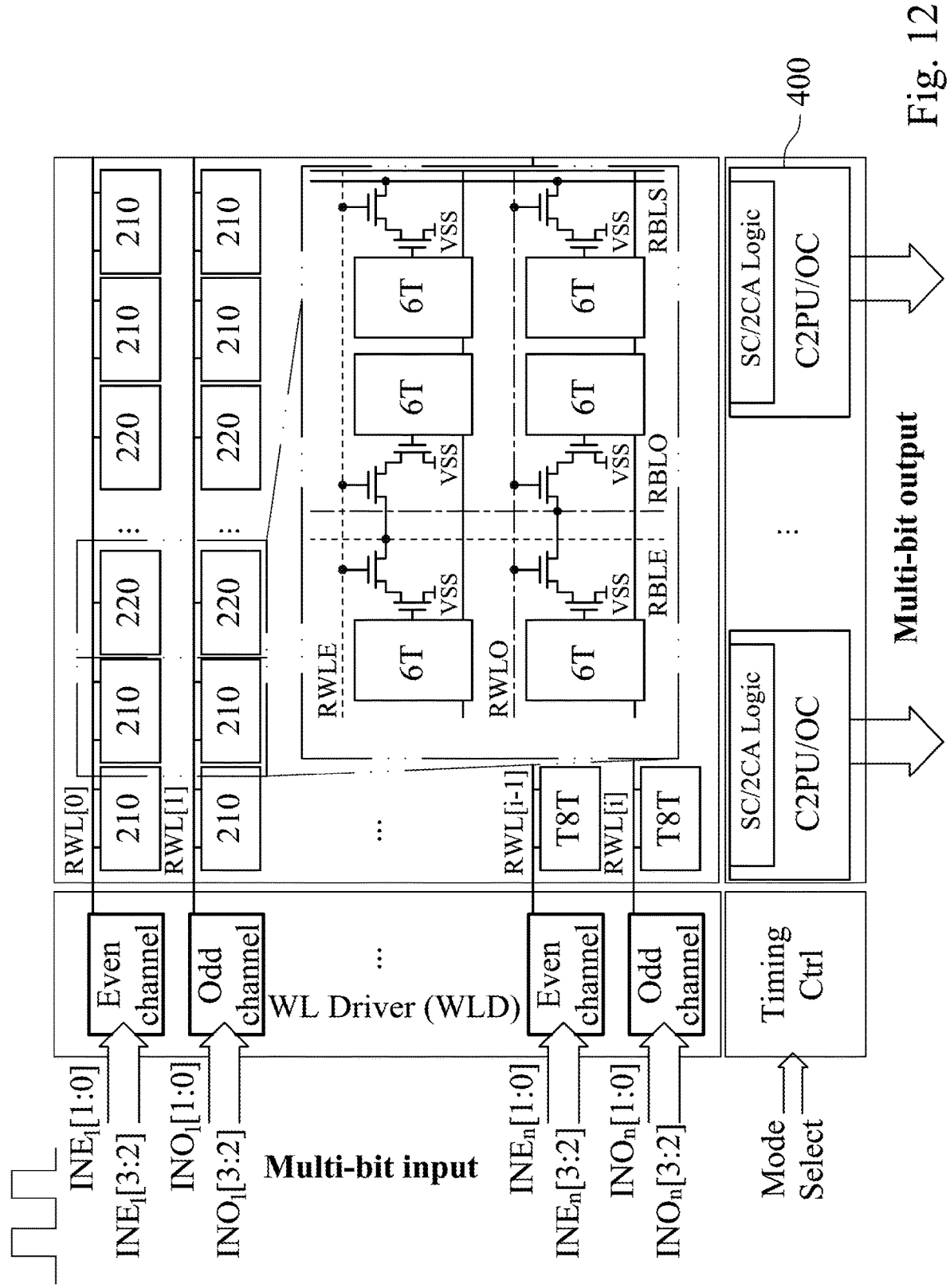
FIG. 12 shows a block diagram of a memory circuit with the even-odd dual channel scheme.
Figure 13:
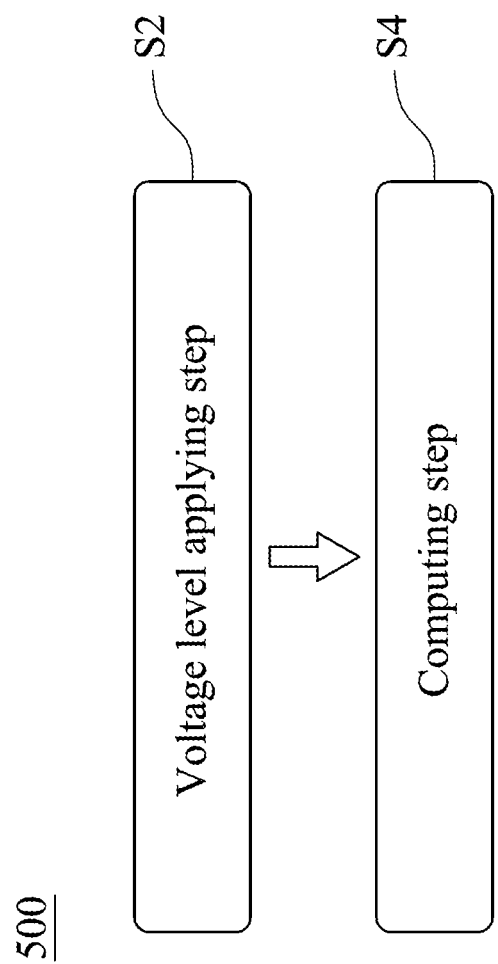
FIG. 13 shows a flow chart of a computing method of a memory unit for computing-in-memory applications according to a fifth embodiment of the present disclosure.

FIG. 12 shows a block diagram of a memory circuit with the even-odd dual channel (EODC) scheme. The EODC scheme supports two operating modes, as listed in Table 2. One of the two operating modes is a single-channel (SC) mode, and the other one of the two operating modes is a two-channel-accumulation (2CA) mode. In the SC mode, one of the even/odd channels ($n^2$ RWLE/RWLOs) is activated, and the read bit lines RBL of the one of the even/odd channels are connected to the two's complement processing units C2PU, respectively. Thanks to a half bit-line loading in the EODC scheme, a settling time of the voltage levels of the read bit lines RBL and power consumption on the read bit lines RBL are lower than that without the EODC scheme. In the 2CA mode, the odd-row read word line RWLO ($n^2$ odd RWLs) and the even-row read word line RWLE ($n^2$ even RWLs) are activated simultaneously for parallel MAC operations on the combined even-row read bit lines RBLE and the combined odd-row read bit lines RBLO. The combined even-row read bit lines RBLE on the same column are shorted. The combined odd-row read bit lines RBLO on the same column are shorted. The multiply accumulate values MACV of the even/odd channels are then accumulated using the same two's complement processing unit C2PU to double the bandwidth over that in the SC mode. The even channels FIG. 13 shows a flow chart of a computing method 500 of a memory unit 200 for computing-in-memory applications according to one embodiment of the present disclosure. The computing method 500 includes a voltage level applying step S2 and a computing step S4. The voltage level applying step S2 is for applying a plurality of voltage levels to the first bit line BL, the second bit line BLB, the word line WL, the read word line RWL and the weight, respectively. The computing step S4 is for driving each of the read-decoupled cells of the memory cells 210 of the memory unit 200 to generate the read bit line signal according to the voltage levels of the input value, the weight and the second transistor width. The detail of the memory unit 200 is the same as the memory unit 200 of FIGS. 1 and 11. In the computing step S4, a combined even-row read bit line signal of the combined even-row read bit line RBLE is equal to a sum of the read bit line signal of the first read-decoupled cell 2102 and the read bit line signal of the second read-decoupled cell 2104 in the even-row memory cell 210. A combined odd-row read bit line signal of the combined odd-row read bit line RBLO is equal to a sum of the read bit line signal of the another first read-decoupled cell 2102 and the read bit line signal of the another second read-decoupled cell 2104 in the odd-row memory cell 210. The combined odd-row read bit line RBLO is disconnected from the combined even-row read bit line RBLE. The read bit line signal of the first read-decoupled cell 2102 in the even-row memory cell 210 is equal to the input value multiplied by two times the weight of the first read-decoupled cell 2102, i.e., the cell located in an upper left corner of FIG. 11. The read bit line signal of the second read-decoupled cell 2104 in the even-row memory cell 210 is equal to the input value multiplied by the weight of the second read-decoupled cell 2104, i.e., the cell located in an upper right corner of FIG. 11. The read bit line signal of the another first read-decoupled cell 2102 in the odd-row memory cell 210 is equal to the input value multiplied by two times the weight of the another first read-decoupled cell 2102, i.e., the cell located in a lower left corner of FIG. 11. The read bit line signal of the another second read-decoupled cell 2104 in the odd-row memory cell 210 is equal to the input value multiplied by the weight of the another second read-decoupled cell 2104, i.e., the cell located in a lower right corner of FIG. 11. Accordingly, the computing method 500 of the present disclosure utilizes compact-rule compatible twin-8T (T8T) cells for weighted CIM multiply accumulate operations to enable full voltage swings on the combined read bit line RBL so as to increase signal margin without the suffering read-disturb or write-disturb issues in a conventional 6T SRAM cell. In addition, the computing method 500 of the present disclosure is suitable for the computing-in-memory applications and may reduce area overhead and vulnerability to process variation.

Figure 14:
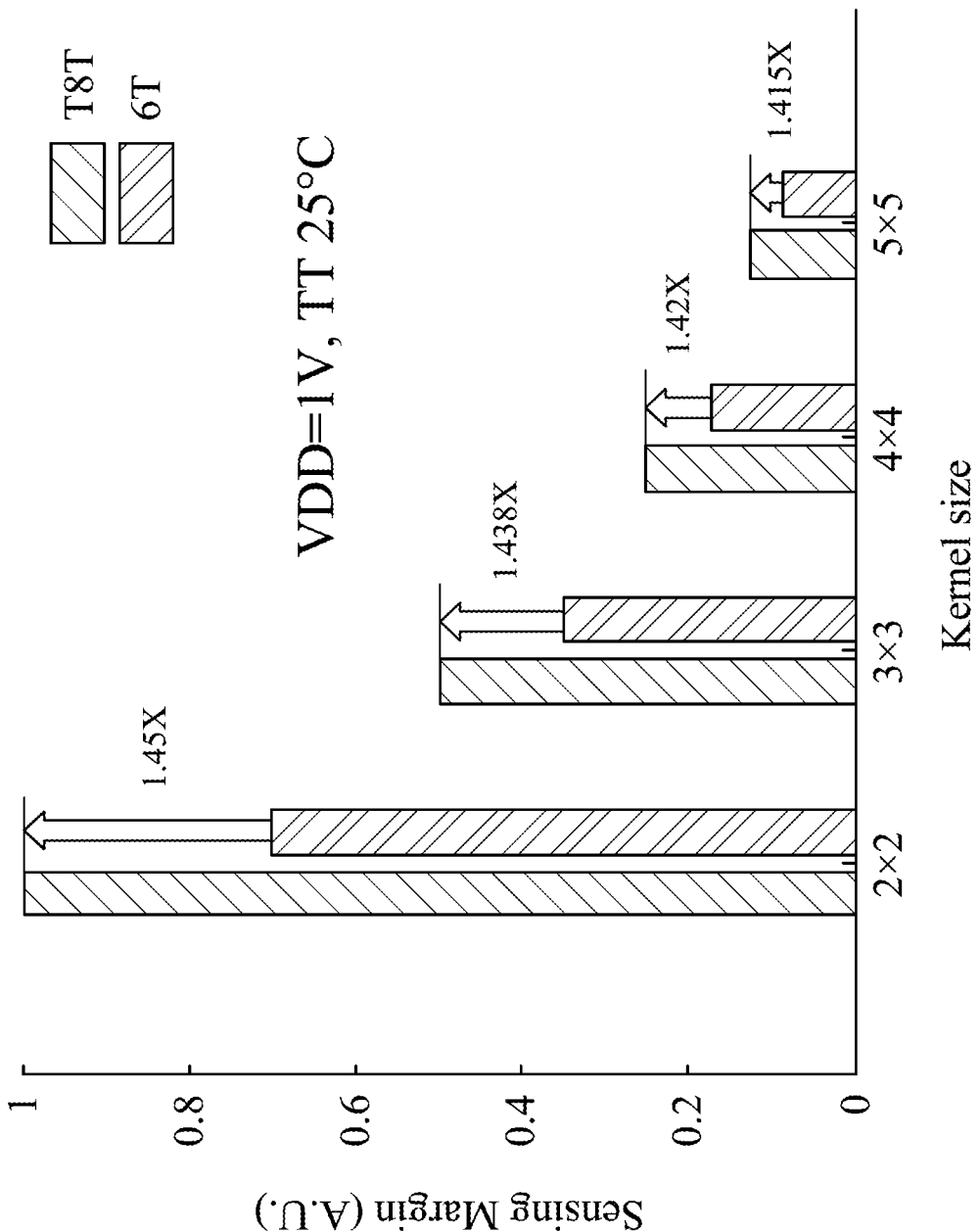
FIG. 14 shows a comparison result of sensing margin between the memory cell of the present disclosure and a conventional 6T memory cell.
Figure 15:
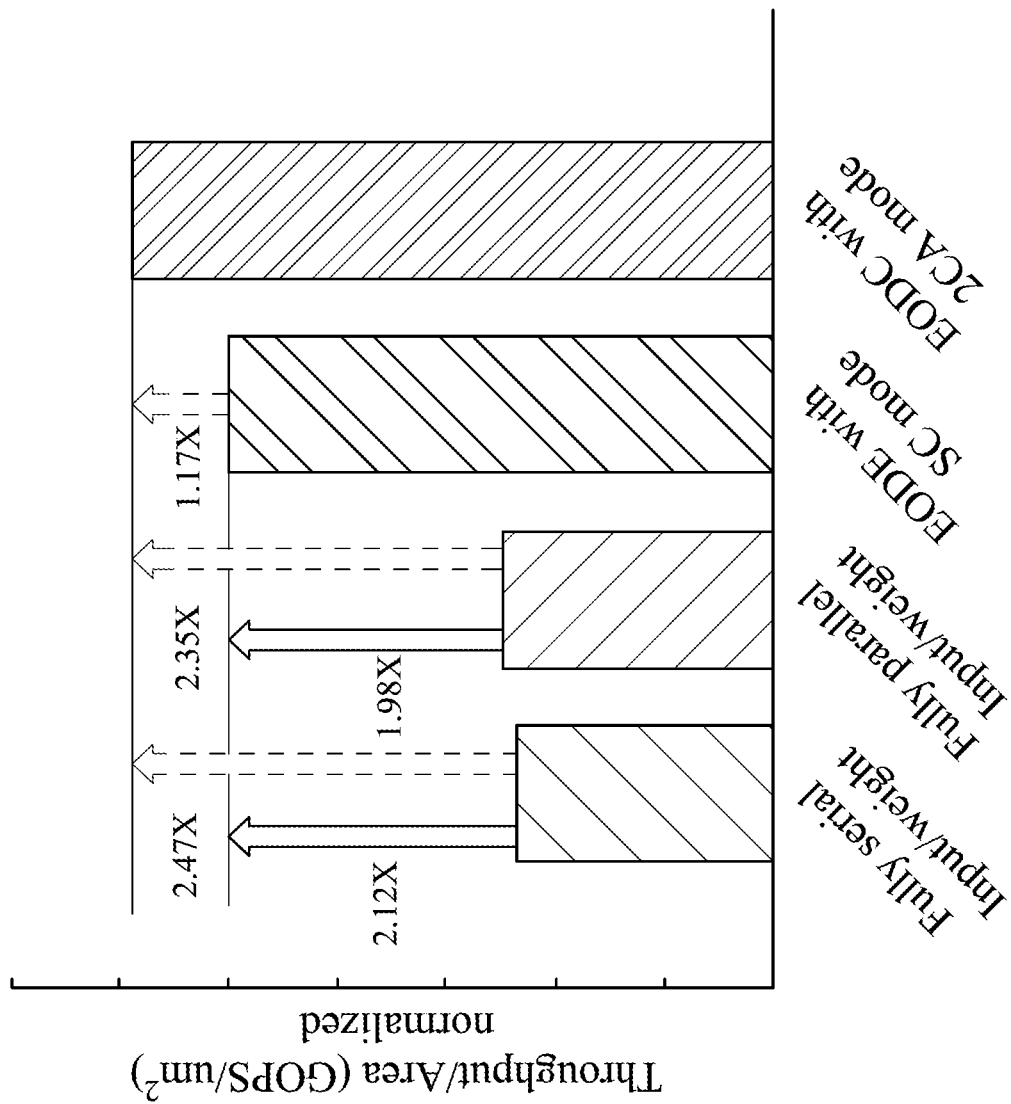
FIG. 15 shows a comparison result of normalized throughput/area between the memory cell of the present disclosure and a conventional 6T memory cell.

FIG. 14 shows a comparison result of sensing margin between the memory cell 210 of the present disclosure and a conventional 6T memory cell. FIG. 15 shows a comparison result of normalized throughput/area between the memory cell 210 of the present disclosure and a conventional 6T memory cell. With a larger voltage swing (no write-disturb) and larger transistor width at the read-port, the memory cell 210 (T8T cell) of the present disclosure achieves a 1.4×–1.6× increase in sensing margin, compared to conventional 6T memory cells with the same MACVout precision. Thanks to its compact area and double the throughput, the SC mode of the EODC scheme achieves a throughput/area figure of merit (FoM) at least 1.98 times larger than that of fully-serial and fully-parallel input/weight structures. In the 2CA mode of the EODC scheme, the memory cell 210 (T8T cell) of the present disclosure can achieve at least 2.35 times better FoM of throughput/area.

According to the aforementioned embodiments and examples, the advantages of the present disclosure are described as follows.

1. The memory cell for the CIM applications, the memory unit for the CIM applications and the computing method thereof of the present disclosure provide a configurable SRAM CIM macro with 1-bit to 4-bit inputs and 1-bit to 5-bit weights with up to 7-bit outputs of the multiply accumulate values MACV. In addition, the present disclosure utilizes compact-rule compatible T8T cells for weighted CIM multiply accumulate operations to enable full voltage swings on the combined read bit line RBL so as to increase signal margin without the suffering read-disturb or write-disturb issues in a conventional 6T SRAM cell.

2. The memory cell for the CIM applications, the memory unit for the CIM applications and the computing method thereof of the present disclosure are suitable for the CIM applications and may reduce area overhead and vulnerability to process variation.

3. The even-odd dual channel scheme of the present disclosure can extend a bandwidth of CNN operations and reduce energy consumption. Moreover, the even-odd dual channel scheme of the present disclosure can reduce half the number of cells and a parasitic load on a conventional read bit line RBL in a conventional memory cell array. By using original metal wires for the read bit line of each memory cell, the combined odd-row read bit line and the combined even-row read bit line in the even-odd dual channel scheme of the present disclosure don't consume extra area in the layout.

4. The memory cell (T8T cell) of the present disclosure can achieve a 1.4×–1.6× increase in sensing margin, compared to conventional 6T memory cells with the same MACVout precision. The SC mode of the EODC scheme of the present disclosure can achieve a throughput/area FoM at least 1.98 times larger than that of fully-serial and fully-parallel input/weight structures. The 2CA mode of the EODC scheme of the present disclosure can achieve at least 2.35 times better FoM of throughput/area.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory cell for computing-in-memory applications, which is controlled by a first bit line, a second bit line, a word line and a read word line, the read word line transmits an input value, and the memory cell for the computing-in-memory applications comprising:
    a plurality of read-decoupled cells connected to the first bit line, the second bit line, the word line and the read word line, wherein each of the read-decoupled cells stores a weight and comprises:
        a first read-decoupled transistor having a first transistor width and controlled by the weight; and
        a second read-decoupled transistor connected to the first read-decoupled transistor and the read word line, wherein the second read-decoupled transistor has a second transistor width equal to the first transistor width and generates a read bit line signal according to the input value, the weight and the second transistor width;
    wherein the second transistor width of the second read-decoupled transistor of one of the read-decoupled cells is two times larger than the second transistor width of the second read-decoupled transistor of another one of the read-decoupled cells.

2. The memory cell for the computing-in-memory applications of claim 1, wherein each of the read-decoupled cells has a first node and a second node, the first node transmits the weight, and each of the read-decoupled cells further comprises:
    a first pass transistor connected to the second node, the second bit line and the word line;
    a second pass transistor connected to the first node, the first bit line and the word line;
    a first inverter located between the first node and the second node; and
    a second inverter connected to the first inverter.

3. The memory cell for the computing-in-memory applications of claim 2, wherein a number of the read-decoupled cells is two, the read-decoupled cells comprise a first read-decoupled cell and a second read-decoupled cell, the first read-decoupled cell is connected to the second read-decoupled cell via the word line, the read word line and a combined read bit line, the combined read bit line has a combined read bit line signal equal to a sum of the read bit line signal of the first read-decoupled cell and the read bit line signal of the second read-decoupled cell.

4. The memory cell for the computing-in-memory applications of claim 3, wherein,
    the first read-decoupled transistor of the first read-decoupled cell has a first read-decoupled gate, a first read-decoupled drain and a first read-decoupled source, the first read-decoupled gate is coupled to the first node of the first read-decoupled cell, and the first read-decoupled source is coupled to a ground voltage; and
    the second read-decoupled transistor of the first read-decoupled cell has a second read-decoupled gate, a second read-decoupled drain and a second read-decoupled source, the second read-decoupled gate is coupled to the read word line, the second read-decoupled drain is coupled to the combined read bit line, and the second read-decoupled source is coupled to the first read-decoupled drain of the first read-decoupled transistor of the first read-decoupled cell.

5. The memory cell for the computing-in-memory applications of claim 4, wherein, the first read-decoupled transistor of the second read-decoupled cell has another first read-decoupled gate, another first read-decoupled drain and another first read-decoupled source, the another first read-decoupled gate is coupled to the first node of the second read-decoupled cell, and the another first read-decoupled source is coupled to the ground voltage; and the second read-decoupled transistor of the second read-decoupled cell has another second read-decoupled gate, another second read-decoupled drain and another second read-decoupled source, the another second read-decoupled gate is coupled to the read word line, the another second read-decoupled drain is coupled to the combined read bit line, and the another second read-decoupled source is coupled to the another first read-decoupled drain of the first read-decoupled transistor of the second read-decoupled cell.

6. The memory cell for the computing-in-memory applications of claim 1, wherein a number of the read-decoupled cells is two, the read-decoupled cells comprises a first read-decoupled cell and a second read-decoupled cell, the first read-decoupled cell is connected to the second read-decoupled cell via the word line and the read word line, the second read-decoupled transistor of the first read-decoupled cell has a second read-decoupled drain to generate a first read bit line signal, the second read-decoupled transistor of the second read-decoupled cell has another second read-decoupled drain to generate a second read bit line signal, and the second read-decoupled drain of the second read-decoupled transistor of the first read-decoupled cell is disconnected from the another second read-decoupled drain of the second read-decoupled transistor of the second read-decoupled cell.

7. The memory cell for the computing-in-memory applications of claim 1, wherein a number of the read-decoupled cells is four, and the read-decoupled cells comprise a first read-decoupled cell, a second read-decoupled cell, a third read-decoupled cell and a fourth read-decoupled cell, the second transistor width of the second read-decoupled transistor of the first read-decoupled cell is two times larger than the second transistor width of the second read-decoupled transistor of the second read-decoupled cell, the second transistor width of the second read-decoupled transistor of the second read-decoupled cell is two times larger than the second transistor width of the second read-decoupled transistor of the third read-decoupled cell, and the second transistor width of the second read-decoupled transistor of the third read-decoupled cell is two times larger than the second transistor width of the second read-decoupled transistor of the fourth read-decoupled cell.

8. The memory cell for the computing-in-memory applications of claim 7, wherein, the first read-decoupled cell is connected to the second read-decoupled cell via the word line, the read word line and a first combined read bit line, and the first combined read bit line has a first combined read bit line signal equal to a sum of the read bit line signal of the first read-decoupled cell and the read bit line signal of the second read-decoupled cell; and the third read-decoupled cell is connected to the fourth read-decoupled cell via the word line, the read word line and a second combined read bit line, and the second combined read bit line has a second combined read bit line signal equal to a sum of the read bit line signal of the third read-decoupled cell and the read bit line signal of the fourth read-decoupled cell.

9. The memory cell for the computing-in-memory applications of claim 1, wherein a number of the read-decoupled cells is four, and the read-decoupled cells comprise a first read-decoupled cell, a second read-decoupled cell, a third read-decoupled cell and a fourth read-decoupled cell, the first read-decoupled cell, the second read-decoupled cell, the third read-decoupled cell and the fourth read-decoupled cell are connected to each other via the word line and the read word line, the second read-decoupled transistor of the first read-decoupled cell has a second read-decoupled drain to generate a first read bit line signal, the second read-decoupled transistor of the second read-decoupled cell has a second read-decoupled drain to generate a second read bit line signal, the second read-decoupled transistor of the third read-decoupled cell has a second read-decoupled drain to generate a third read bit line signal, the second read-decoupled transistor of the fourth read-decoupled cell has a second read-decoupled drain to generate a fourth read bit line signal, and the second read-decoupled drain of the second read-decoupled transistor of the first read-decoupled cell, the second read-decoupled drain of the second read-decoupled transistor of the second read-decoupled cell, the second read-decoupled drain of the second read-decoupled transistor of the third read-decoupled cell and the second read-decoupled drain of the second read-decoupled transistor of the fourth read-decoupled cell are disconnected from each other.

10. A memory unit for computing-in-memory applications, which is controlled by a first bit line, a second bit line, a word line and a read word line, the read word line transmits an input value, and the memory unit for the computing-in-memory applications comprising:

a plurality of memory cells arranged in matrix, wherein each of the memory cells is one of an even-row memory cell and an odd-row memory cell, the even-row memory cell is located in an even row, the odd-row memory cell is located in an odd row, and each of the memory cells comprising:

a plurality of read-decoupled cells connected to the first bit line, the second bit line, the word line and the read word line, wherein each of the read-decoupled cells stores a weight and comprises:

a first read-decoupled transistor having a first transistor width and controlled by the weight; and a second read-decoupled transistor connected to the first read-decoupled transistor and the read word line, wherein the second read-decoupled transistor has a second transistor width equal to the first transistor width and generates a read bit line signal according to the input value, the weight and the second transistor width;

wherein in each of the memory cells, the second transistor width of the second read-decoupled transistor of one of the read-decoupled cells is two times larger than the second transistor width of the second read-decoupled transistor of another one of the read-decoupled cells.

11. The memory unit for the computing-in-memory applications of claim 10, wherein each of the read-decoupled cells has a first node and a second node, the first node transmits the weight, and each of the read-decoupled cells further comprises:
a first pass transistor connected to the second node, the second bit line and the word line;
a second pass transistor connected to the first node, the first bit line and the word line;
a first inverter located between the first node and the second node; and
a second inverter connected to the first inverter.

12. The memory unit for the computing-in-memory applications of claim 11, wherein a number of the memory cells is two, a number of the read-decoupled cells is two;
the read-decoupled cells of the even-row memory cell comprise a first read-decoupled cell and a second read-decoupled cell, the first read-decoupled cell is connected to the second read-decoupled cell via the word line, the read word line and a combined even-row read bit line, and the second read-decoupled transistor of the first read-decoupled cell, the second read-decoupled transistor of the second read-decoupled cell and the combined even-row read bit line are connected to each other.

13. The memory unit for the computing-in-memory applications of claim 12, wherein the read-decoupled cells of the odd-row memory cell comprise another first read-decoupled cell and another second read-decoupled cell, the another first read-decoupled cell is connected to the another second read-decoupled cell via the word line, the read word line and a combined odd-row read bit line, and the second read-decoupled transistor of the another first read-decoupled cell, the second read-decoupled transistor of the another second read-decoupled cell and the combined odd-row read bit line are connected to each other;
wherein the combined odd-row read bit line is disconnected from the combined even-row read bit line.

14. The memory unit for the computing-in-memory applications of claim 10, wherein a number of the read-decoupled cells of each of the memory cells is four, and the read-decoupled cells of each of the memory cells comprise a first read-decoupled cell, a second read-decoupled cell, a third read-decoupled cell and a fourth read-decoupled cell, the second transistor width of the second read-decoupled transistor of the first read-decoupled cell is two times larger than the second transistor width of the second read-decoupled transistor of the second read-decoupled cell, the second transistor width of the second read-decoupled transistor of the second read-decoupled cell is two times larger than the second transistor width of the second read-decoupled transistor of the third read-decoupled cell, and the second transistor width of the second read-decoupled transistor of the third read-decoupled cell is two times larger than the second transistor width of the second read-decoupled transistor of the fourth read-decoupled cell.

15. The memory unit for the computing-in-memory applications of claim 14, wherein,
the first read-decoupled cell is connected to the second read-decoupled cell via the word line, the read word line and a first combined read bit line, and the first combined read bit line has a first combined read bit line signal equal to a sum of the read bit line signal of the first read-decoupled cell and the read bit line signal of the second read-decoupled cell; and
the third read-decoupled cell is connected to the fourth read-decoupled cell via the word line, the read word line and a second combined read bit line, and the second combined read bit line has a second combined read bit line signal equal to a sum of the read bit line signal of the third read-decoupled cell and the read bit line signal of the fourth read-decoupled cell.

16. A computing method of the memory unit for the computing-in-memory applications of claim 10, comprising:
providing a voltage level applying step, wherein the voltage level applying step is for applying a plurality of voltage levels to the first bit line, the second bit line, the word line, the read word line and the weight, respectively; and
providing a computing step, wherein the computing step is for driving each of the read-decoupled cells of the memory cells of the memory unit to generate the read bit line signal according to the voltage levels of the input value, the weight and the second transistor width.

17. The computing method of claim 16, wherein a number of the memory cells is two, a number of the read-decoupled cells is two, the read-decoupled cells of the even-row memory cell comprise a first read-decoupled cell and a second read-decoupled cell, the first read-decoupled cell is connected to the second read-decoupled cell via the word line, the read word line and a combined even-row read bit line, the second read-decoupled transistor of the first read-decoupled cell, the second read-decoupled transistor of the second read-decoupled cell and the combined even-row read bit line are connected to each other;
wherein in the computing step, a combined even-row read bit line signal of the combined even-row read bit line is equal to a sum of the read bit line signal of the first read-decoupled cell and the read bit line signal of the second read-decoupled cell in the even-row memory cell.

18. The computing method of claim 17, wherein the read-decoupled cells of the odd-row memory cell comprise another first read-decoupled cell and another second read-decoupled cell, the another first read-decoupled cell is connected to the another second read-decoupled cell via the word line, the read word line and a combined odd-row read bit line, the second read-decoupled transistor of the another first read-decoupled cell, the another second read-decoupled transistor of the second read-decoupled cell and the combined odd-row read bit line are connected to each other;
wherein in the computing step, a combined odd-row read bit line signal of the combined odd-row read bit line is equal to a sum of the read bit line signal of the another first read-decoupled cell and the read bit line signal of the another second read-decoupled cell in the odd-row memory cell.

19. The computing method of claim 18, wherein the combined odd-row read bit line is disconnected from the combined even-row read bit line.

20. The computing method of claim 18, wherein in the computing step,
the read bit line signal of the first read-decoupled cell in the even-row memory cell is equal to the input value multiplied by two times the weight of the first read-decoupled cell;
the read bit line signal of the second read-decoupled cell in the even-row memory cell is equal to the input value multiplied by the weight of the second read-decoupled cell;
the read bit line signal of the another first read-decoupled cell in the odd-row memory cell is equal to the input value multiplied by two times the weight of the another first read-decoupled cell; and
the read bit line signal of the another second read-decoupled cell in the odd-row memory cell is equal to the input value multiplied by the weight of the another second read-decoupled cell.

* * * * *